United States Patent
Chang et al.

(10) Patent No.: US 10,120,605 B2
(45) Date of Patent: Nov. 6, 2018

(54) DATA ALLOCATING METHOD AND ELECTRIC SYSTEM USING THE SAME

(71) Applicant: MACRONIX INTERNATIONAL CO., LTD., Hsinchu (TW)

(72) Inventors: Hung-Sheng Chang, Taipei (TW); Yu-Ming Chang, Pingtung County (TW); Hsiang-Pang Li, Zhubei (TW); Yuan-Hao Chang, Taipei (TW); Tei-Wei Kuo, New Taipei (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 134 days.

(21) Appl. No.: 15/093,841

(22) Filed: Apr. 8, 2016

(65) Prior Publication Data

US 2017/0147217 A1  May 25, 2017

Related U.S. Application Data

(60) Provisional application No. 62/259,663, filed on Nov. 25, 2015.

(51) Int. Cl.
| | |
|---|---|
| G06F 12/00 | (2006.01) |
| G06F 3/06 | (2006.01) |
| G11C 16/10 | (2006.01) |
| G11C 16/34 | (2006.01) |
| G11C 11/56 | (2006.01) |

(52) U.S. Cl.
CPC ............ *G06F 3/064* (2013.01); *G06F 3/0619* (2013.01); *G06F 3/0644* (2013.01); *G06F 3/0659* (2013.01); *G06F 3/0679* (2013.01); *G11C 11/5628* (2013.01); *G11C 16/10* (2013.01); *G11C 16/3427* (2013.01); *G11C 2211/5641* (2013.01); *G11C 2211/5648* (2013.01)

(58) Field of Classification Search
CPC .... G06F 12/00; G06F 3/0679; G06F 12/0238; G06F 12/0246; G06F 3/064; G06F 3/0644; G06F 3/0659
USPC .......................................... 711/100, 103, 154
See application file for complete search history.

(56) References Cited

U.S. PATENT DOCUMENTS

| | | | | |
|---|---|---|---|---|
| 2008/0082729 | A1* | 4/2008 | Moon ................. | G06F 12/0246 711/103 |
| 2009/0113112 | A1* | 4/2009 | Ye et al. ................. | G06F 12/02 711/102 |
| 2011/0264843 | A1* | 10/2011 | Haines ................ | G06F 12/0246 711/103 |
| 2012/0317337 | A1* | 12/2012 | Johar .................. | G06F 12/0246 711/103 |
| 2016/0132392 | A1* | 5/2016 | Ioannou ................ | G06F 3/0619 714/766 |
| 2017/0024137 | A1* | 1/2017 | Kanno .................. | G06F 3/0604 |

* cited by examiner

*Primary Examiner* — Tuan Thai
(74) *Attorney, Agent, or Firm* — McClure, Qualey & Rodack, LLP

(57) ABSTRACT

A data allocating method includes steps of: determining whether data to be written into a physical memory block is hot data or cold data; when the data is hot data, according to a hot data allocating order, searching at least one first empty sub-block from the physical memory block to allocate the data; when the data is cold data, according to a cold data allocating order, searching at least one second empty sub-block from the physical memory block to allocate the data.

18 Claims, 8 Drawing Sheets

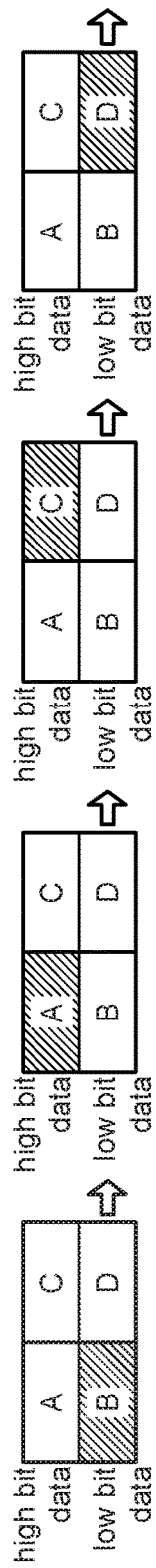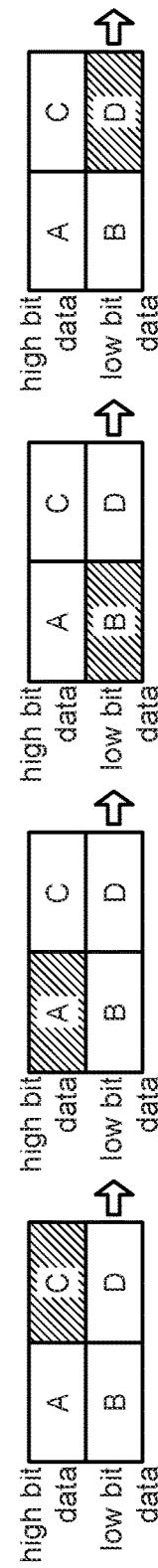

DATA ALLOCATING METHOD AND ELECTRIC SYSTEM USING THE SAME

This application claims the benefit of U.S. provisional application Ser. No. 62/259,663, filed Nov. 25, 2015, the disclosure of which is incorporated by reference herein in its entirety.

TECHNICAL FIELD

The disclosure relates in general to a data allocating method and an electronic system using the same, and more particular to a data allocating method for improving program disturb and an electric system using the same.

BACKGROUND

Flash memory is a kind of non-volatile memory. Flash memory has advantages of fast access speed and low power consumption. Typically, flash memory may utilize memory cells with floating gates to store data. Through inject/release electrons to the floating gates, the threshold voltage distributions of the memory cells can be changed to certain data state.

However, as the density of memory devices increased and the memory cells getting more compact, effects of program disturb become more obvious. For example, when a selected memory cell in a NAND flash memory is being programmed, the threshold voltages of the nearby memory cells will be shifted due to program disturb, such that the original bias voltage settings fail to read the data correctly.

SUMMARY

The disclosure relates in general to a data allocating method for improving program disturb and an electric system using the same.

According to one aspect of the present invention, a data allocating method is provided. The data allocating method includes steps of: determining whether data to be written into a physical memory block is hot data or cold data; when the data is hot data, according to a hot data allocating order, searching for at least one first empty sub-block from the physical memory block to allocate the data, wherein based on the hot data allocating order, an empty sub-block whose program priority in the physical memory block is higher and whose tolerable margin between two data states is narrower is prior selected as the at least one first empty sub-block; when the data is cold data, according to a cold data allocating order, searching for at least one second empty sub-block from the physical memory block to allocate the data, wherein based on the cold data allocating order, an empty sub-block whose program priority in the physical memory block is lower and whose tolerable margin is broader is prior selected as the at least one second empty sub-block.

According to one aspect of the present invention, an electric system is provided. The electric system includes a memory and a controller. The memory includes a physical memory block. The controller, coupled to the memory, is configured to: determine whether data to be written into the physical memory block is hot data or cold data; when the data is hot data, according to a hot data allocating order, search for at least one first empty sub-block from the physical memory block to allocate the data, wherein based on the hot data allocating order, an empty sub-block whose program priority in the physical memory block is higher and whose tolerable margin between two data states is narrower is prior selected as the at least one first empty sub-block; and when the data is cold data, according to a cold data allocating order, search for at least one second empty sub-block from the physical memory block to allocate the data, wherein based on the cold data allocating order, an empty sub-block whose program priority in the physical memory block is lower and whose tolerable margin is broader is prior selected as the at least one second empty sub-block.

BRIEF DESCRIPTION OF THE DRAWINGS

FIG. 8 illustrates the priority for allocating hot data for the sub-blocks shown in FIG. 7.

FIG. 9 illustrates the priority for allocating cold data for the sub-blocks in FIG. 7.

Figure 1:
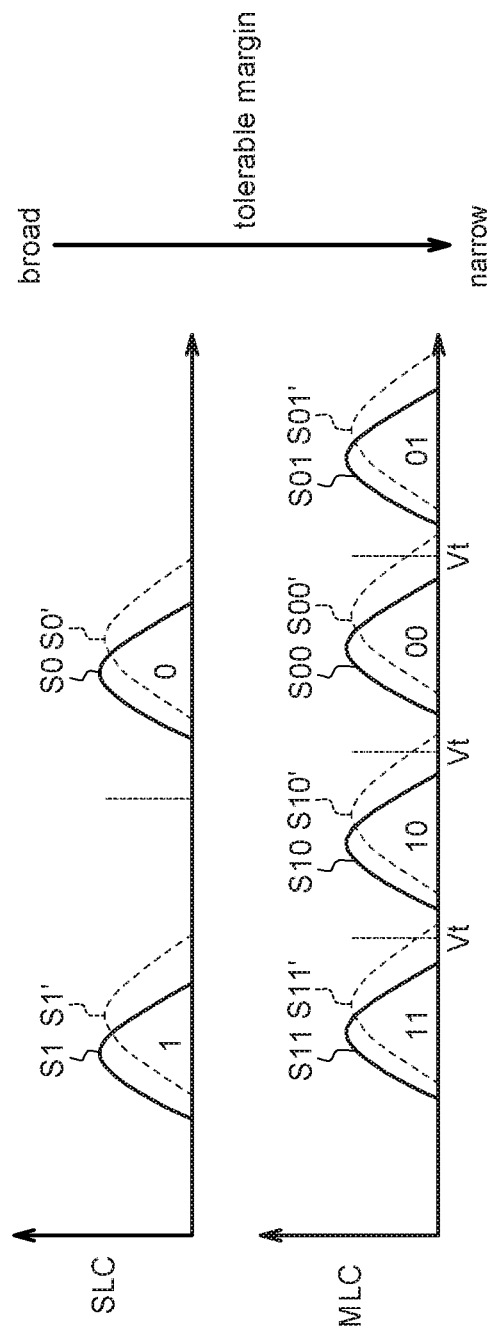
FIG. 1 shows threshold voltage distributions of different types of memory cells effected by program disturb.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

A number of embodiments are disclosed below for elaborating the invention. However, the embodiments of the invention are for detailed descriptions only, not for limiting the scope of protection of the invention. Furthermore, secondary or unimportant elements are omitted in the accompanying diagrams of the embodiments for highlighting the technical features of the invention.

FIG. 1 shows threshold voltage distributions of different types of memory cells. As shown in FIG. 1, memory cells such as single level cells (SLCs) are used for storing 1-bit data, and memory cells such as multi level cells (MLCs) are used for storing 2-bit data. As more bits of data are stored per cell, the distributions corresponding to different data states will become closer to each other, resulting in a narrower tolerable margin between the distributions. The tolerable margin represents the minimum tolerable spacing between two adjacent data states.

Specifically, a SLC may store one bit of data, therefore, in a certain range of threshold voltage, it can be programmed to a threshold voltage distribution S0 or S1 to represent a data state of "0" or "1". In addition, a MLC may store two bits of data, therefore, in a certain range of threshold voltage level, it can be programmed to a threshold voltage distribution S11, S10, S00, or S01 to represent a data state of '11', '10', '00', or '01'. When programming a MLC, the data programmed in the SLC mode is called high bit data (in this example, it represents the first bit of the 2-bit data), while the data programmed in the MLC mode is called low bit data (in this example, it represents the second bit of the 2-bit data). Typically, when more bits of data are stored per cell, the tolerable margin for programming the lower bit of data will become narrower. Taking a triple-level cell (TLC) as example, the tolerable margin for programming the high bit data>the tolerable margin for programming the middle bit data>the tolerable margin for programming the low bit data.

Program disturb may lead to a shift of original threshold voltage distribution of a memory cell. As shown in FIG. 1, due to program disturb, the threshold voltage distributions S1 and S0 of a SLC may shift to the threshold voltage distributions S1' and S0', and the threshold voltage distributions S11, S10, S00, and S01 of a MLC may shift to the threshold voltage distributions S11', S10', S00', and S01'. Therefore, when a tolerable margin between two data states becomes broader, even though the threshold voltage distributions are shifted, data can still be read out by default bias voltage settings (as the sensing voltage Vt shown in the figure). In the contrary, when a tolerable margin between two data states become narrower, the distribution shift caused by program disturb may cause data stored in memory cells fails to be read out by the default bias voltage settings.

In another aspect, while programming a selected memory cell, the nearby memory cells are subject to program disturb, therefore, only the memory cells programmed in the later time sequence may affect the memory cells programmed in the previous time sequence. Base on the characteristic described, a program disturb durability for a certain data storing location can be defined. When the program disturb durability is higher, errors caused by program disturb occur less in the data storing location.

According to the embodiments of the present invention, data storing locations with low program disturb durability are preferably chosen to be allocated hot data, while the data storing locations with high program disturb durability are preferably chosen to be allocated cold data. Hot data represents data that is frequently written, while cold data represents data that is less frequently written.

Due to the property of out-of-place update of flash memory, when an updated data is written to a new empty location, the obsolete data becomes invalid. Therefore, when the written data is hot data, the written data has a high possibility to become invalid. Since the effects of program disturb to an invalid data can be ignored, the effects of program disturb in a memory can be reduced by choosing empty location(s) with lower program disturb durability to allocate the hot data. On the contrary, if the written data is cold data, the written data has a low possibility to become invalid. In this situation, the cold data can be protected from the effects of program disturb by choosing empty location(s) with higher program disturb durability to allocate the cold data.

Figure 2:
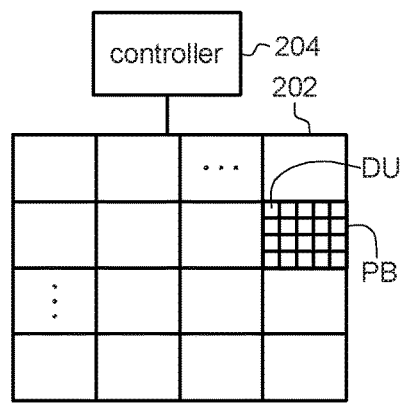
FIG. 2 is a simplified block diagram of an electronic system 200 according to an embodiment of the present invention.

FIG. 2 is a simplified block diagram of an electronic system 200 according to an embodiment of the present invention. The electronic system 200 includes a memory 202 and a controller 204. The memory 202 can be a 2-dimensional or 3-dimensional NAND flash memory, or any other type of memory. The memory 202 includes one or more physical memory blocks PB. Taking NAND flash memory as example, one physical memory block PB is the smallest unit for executing an erase operation. The physical memory block PB includes multiple data units DU. These data units DU can further be partitioned into multiple virtual sub-blocks for operation (details about the partition will be elaborated). One data unit DU can be a data page or any other basic data management unit, depending on the type of memory.

The controller 204 couples to the memory 202, and is configured to execute the data allocating method of the present invention. The controller 204 can be a central computing unit, a micro processor, or any other operating circuits that can execute operations such as write/program, read, erase for the memory 202.

Figure 3:
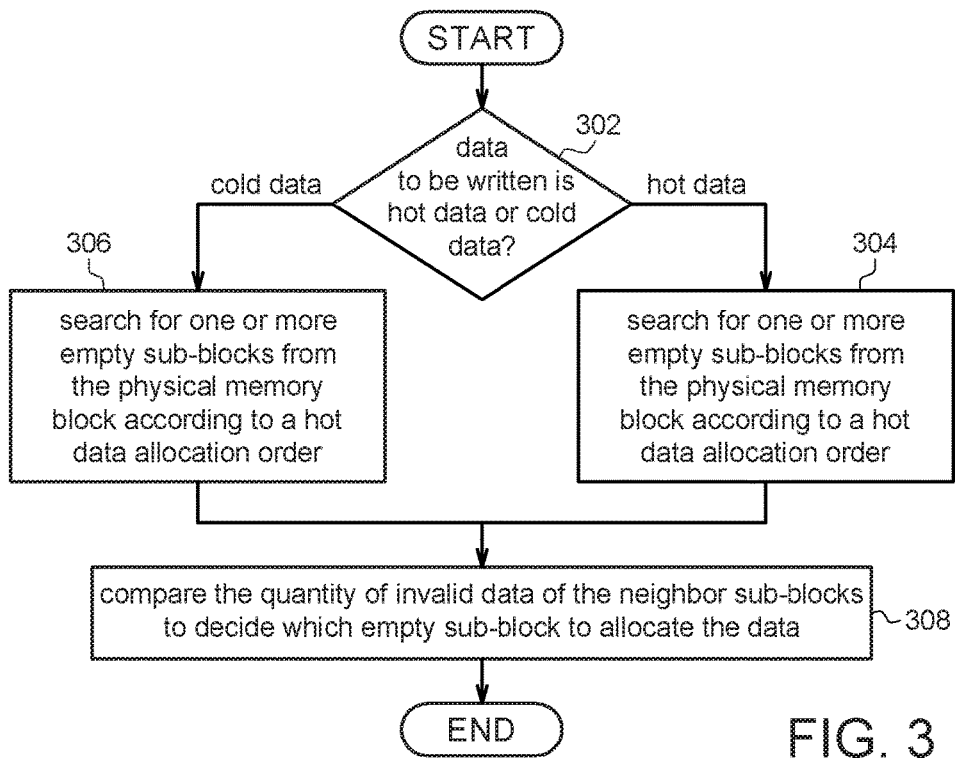
FIG. 3 is a flowchart of a data allocating method according to an embodiment of present invention.

FIG. 3 is a flowchart of a data allocating method according to an embodiment of present invention. The exemplary data allocating method can be executed by, for example, the controller 204 of the electronic system 200 shown in FIG. 2.

In step 302, the controller 204 determines whether data to be written into the physical memory block PB is hot data or cold data. In an embodiment, the controller 204 may determine the cold/hot features of the data by recording the quantity/frequency of writing of the data.

In step 304, if the data to be written is hot data, the controller 204 may search for one or more empty sub-blocks from the physical memory block PB according to a hot data allocation order to allocate the data.

The hot data allocation order can be decided by the following two principles: (1) When a data storing location has lower program disturb durability, it has a higher priority to be allocated with hot data, and/or (2) If the data storing location chosen based on principle (1) will cause program disturb to a data storing location with the lowest program disturb durability, the sub-block will be skipped for another data storing location (e.g., the next data storing location chosen by principle (1)), to prevent the data storing location with the lowest program disturb durability from being affected by program disturb.

Therefore, based on the hot data allocation order, an empty sub-block whose program priority in the physical memory block PB is higher and whose tolerable margin between two data states is narrower will be prior selected as the sub-block to allocate the hot data. In other words, an empty sub-block with lower program disturb durability will be prior selected as the sub-block to place the hot data.

Moreover, if programming the empty sub-block will cause program disturb to the sub-block with the lowest program disturb durability in the physical memory block PB, the controller 204 will skip the empty sub-block, and turn to find another empty sub-block to allocate the hot data, to avoid program disturb to the sub-block with the lowest program disturb durability, wherein the sub-block with the lowest program disturb durability is with the highest program priority in the physical memory block PB and with the narrowest tolerable margin.

In step 306, if the data to be written is cold data, the controller 204 may search for one or more empty sub-blocks from the physical memory block PB according to a cold data allocation order to allocate the data.

The cold data allocation order can be decided based on two following principles: (1) When a data storing location has a higher program disturb durability, it has a higher priority to be allocated with cold data, and/or (2) If the data storing location chosen based on principle (1) will cause program disturb to the data storing location with the lowest program disturb durability, the data storing location is skipped for another data storing location (e.g., the next data storing location chosen by principle (1)), to prevent the data storing location with the lowest program disturb durability from being affected by program disturb.

Therefore, based on the cold data allocation order, an empty sub-block whose program priority in the physical memory block PB is lower and whose tolerable margin is broader is prior selected as the empty sub-block to allocate the cold data. In other words, an empty sub-block with higher program disturb durability will be prior selected as the sub-block to allocate the cold data.

Moreover, if programming the empty sub-block will cause program disturb to a sub-block with the lowest program disturb durability in the physical memory block PB, the controller 204 will skip the empty sub-block, and turn to find another empty sub-block to allocate the cold data, to avoid program disturb to the sub-block with the lowest program disturb durability.

If the controller 204 simultaneously finds multiple empty sub-blocks able to be allocated the hot/cold data based on step 304/306, the controller 204 will execute step 308, by comparing the quantity of invalid data of the neighbor sub-blocks (e.g., the sub-blocks physically adjoin to the empty sub-blocks) to decide which empty sub-block to allocate the data.

For example, if data to be written is hot data, and the controller 204 has found multiple empty sub-blocks able to be allocated the hot data based on step 304, the controller 204 will compare the quantity of invalid data in each neighbor sub-block, and write the data into one of the empty sub-blocks neighboring the most invalid data. In this manner, the program disturb can be better spread to invalid data, to reduce the effects from program disturb to valid data.

Similarly, if data to be written is cold data, and the controller 204 has found multiple second empty sub-blocks able to be allocated the cold data based on step 304, the controller 204 will compare the quantity of invalid data in each neighbor sub-block, and write the data into one of the empty sub-blocks neighboring the most invalid data.

According to the embodiments of the present invention, the data units DU in the physical memory block PB can be virtually partitioned into multiple sub-blocks according to a physical location interleaving condition and/or a data leveling condition. These sub-blocks are virtual units, i.e., virtual management units, which can be operated by controller or related management software layers of a storage system (e.g., file system, flash translation layer (FTL), and memory technology device (MTD)). The virtual units are not physical erase units in a memory. The physical location interleaving condition means that the data units DU in a sub-block are physically discontinuous. The data leveling condition means that the data units DU corresponding to different data levels are categorized to different sub-blocks. In the following, explanations will continue with the support of FIGS. 4a-4c, 5 and 6. It is noted that the examples are only for illustration, not for limiting the present invention. In the physical memory block PB, the quantity, type, and structure allocation could be different, depending on different applications.

Figure 4A:
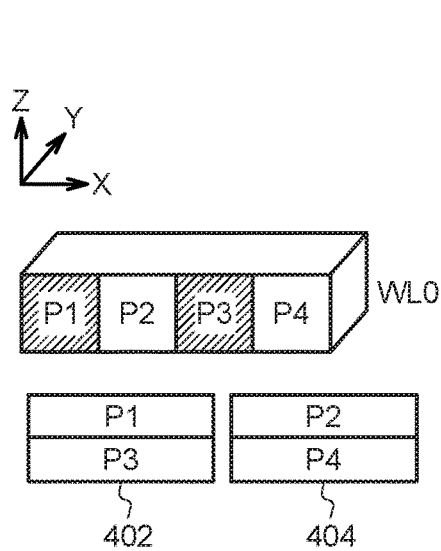
FIG. 4a illustrates an example showing data units partitioned to sub-blocks according to the physical location interleaving condition.

FIG. 4a illustrates an example showing that the data units DU (taking data pages as example) are partitioned to sub-blocks according to the physical location interleaving condition. As shown in FIG. 4a, the word line WL0 in a physical memory block is corresponding to data pages P1, P2, P3, and P4. The data pages P1-P4 are lined up along with X-axis. Based on physical location interleaving condition, the data pages P1 and P3 are categorized to the same sub-block 402, and data pages P2 and P4 are categorized into another sub-block 404. In other words, for the sub-block 402, the data pages P1 and P3 are not physically adjacent to each other; for the sub-block 404, the data pages P2 and P4 are not physically adjacent to each other.

Figure 4B:
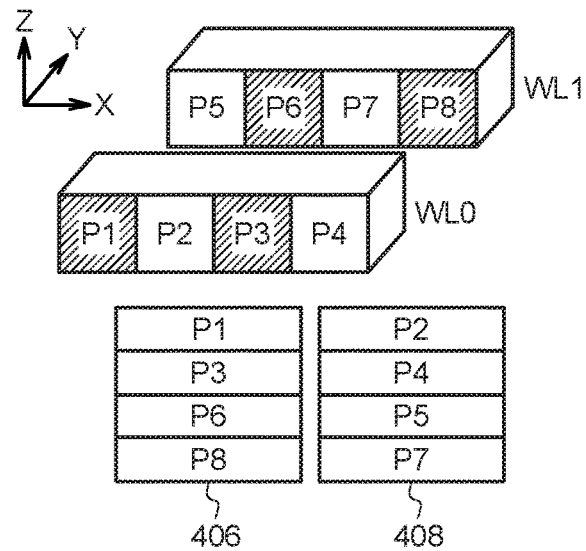
FIG. 4b illustrates another example showing data units partitioned to sub-blocks according to the physical location interleaving condition.

FIG. 4b illustrates another example showing that the data units DU (taking data pages as example) are partitioned to sub-blocks according to the physical location interleaving condition. As shown in FIG. 4b, the word line WL0 in a physical memory block is corresponding to the data pages P1-P4 that are lined up along with X-axis, and the word line WL1 is corresponding to the data pages P5-P8 that are lined up along with Y-axis. Based on the physical location interleaving condition, the data pages P1, P3, P6, and P8 are categorized into the same sub-block 406, and the data page P2, P4, P5 and P7 are categorized into another sub-block 408. In other words, for the sub-blocks 406, the data pages P1, P3, P6, and P8 are not physically adjacent to each other; for the sub-blocks 408, P2, P4, P5 and P7 are not physically adjacent to each other.

Figure 4C:
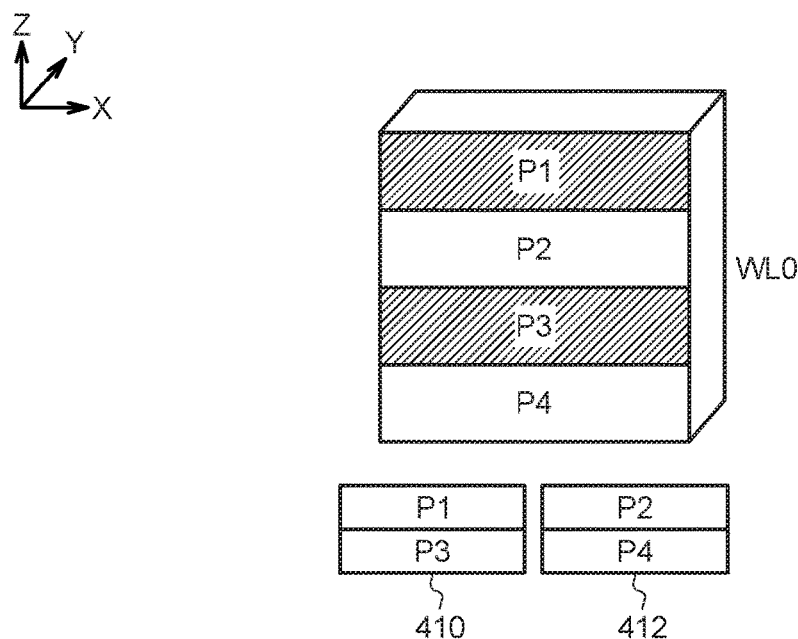
FIG. 4c illustrates yet another example showing data units partitioned to sub-blocks according to the physical location interleaving condition.

FIG. 4c illustrates yet another example showing that the data units DU (taking data pages as example) are partitioned to sub-blocks according to the physical location interleaving condition. As shown in FIG. 4c, the word line WL0 in a physical memory block is corresponding to the data pages P1-P4 lined up along with Z-axis. Based on physical location interleaving condition, the data pages P1 and P3 are categorized into the same sub-block 410, and the data page P2 and P4 are categorized into another sub-block 412. In other words, for the sub-block 410, the data pages P1 and P3 are not physically adjacent to each other; for the sub-block 412, the data pages P2 and P4 are not physically adjacent to each other.

Figure 5:
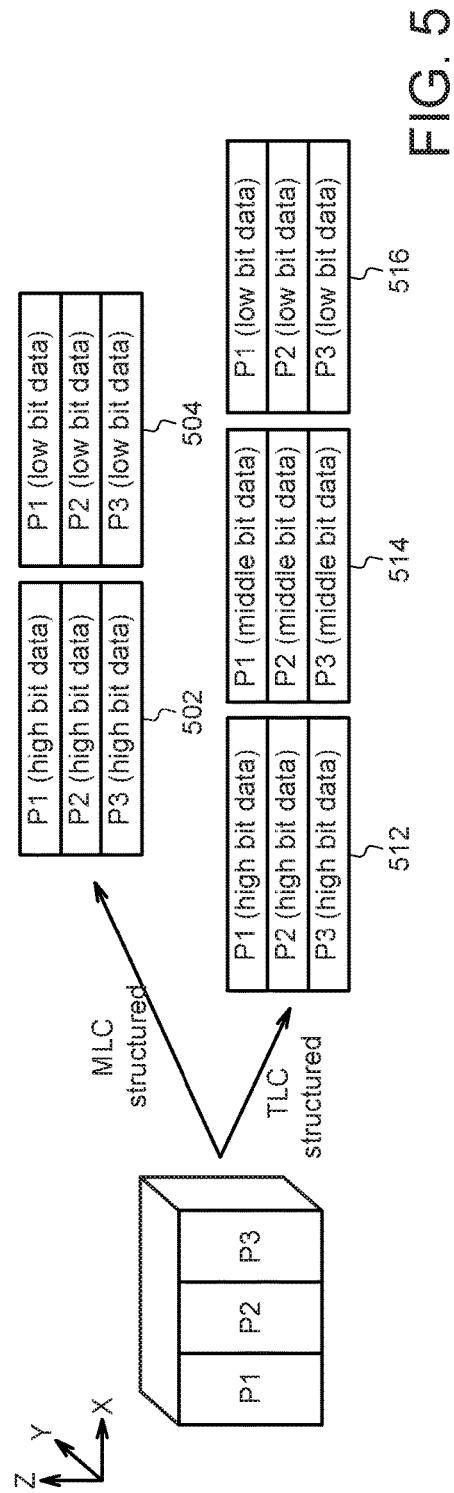
FIG. 5 illustrates an example showing data units partitioned to sub-blocks according to the data leveling condition.

FIG. 5 illustrates an example showing that the data units DU (taking data pages as example) are partitioned to sub-blocks according to the data leveling condition. If the data pages P1, P2, and P3 are MLC structured, then the data pages P1, P2, and P3 can be virtually categorized to a sub-block 502 for storing the high bit data, and categorized to a sub-block 504 for storing the low bit data. Likewise, if the data pages P1, P2, and P3 are TLC structured, then the data pages P1, P2, and P3 can be virtually categorized to a sub-block 512 for storing high bit data, categorized to a sub-block 514 for storing the middle bit data, and categorized to a sub-block 516 for storing the low bit data. In general, if the data units DU in the physical memory block PB are consist of N-level memory cells, then, based on data leveling condition, the plurality of data units DU can be partitioned to sub-block(s) for storing the first bit data, sub-block(s) for storing the second bit data, . . . , and sub-block(s) for storing the N-th bit data, where N is a positive integer.

Figure 6:
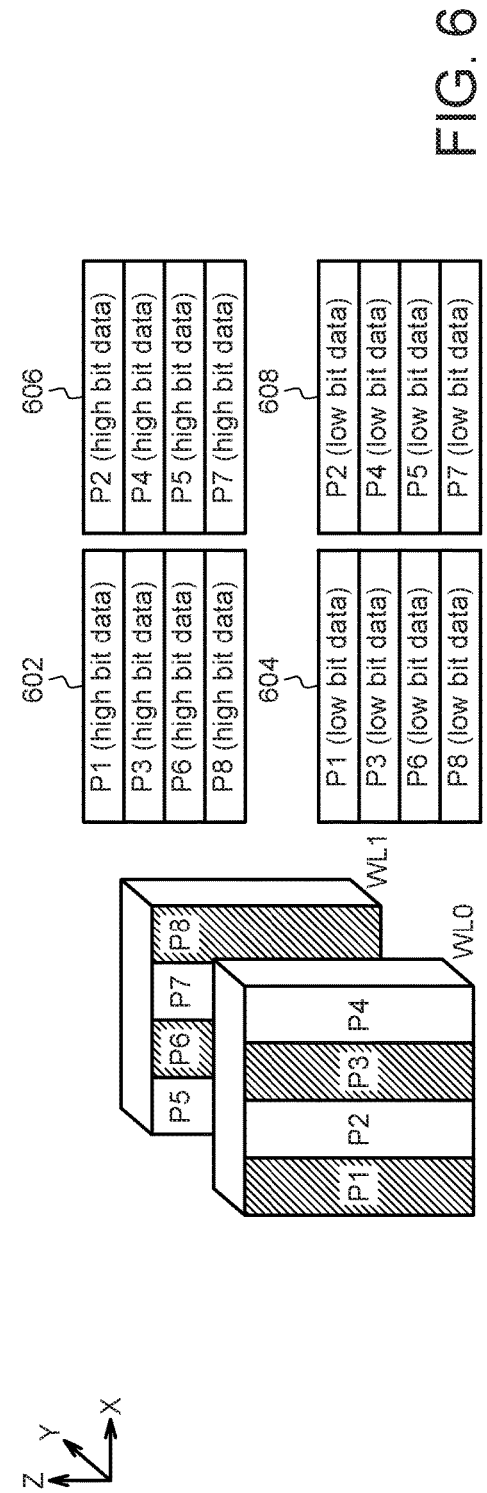
FIG. 6 illustrates an example showing data units partitioned to form sub-blocks according to the physical location interleaving condition and the data leveling condition.

FIG. 6 illustrates an example showing that the data units DU (taking data pages as example) are partitioned to sub-blocks according to the physical location interleaving condition and the data leveling condition. In this example, the word line WL0 in a physical memory block is corresponding to the data pages P1-P4 lined up along with X-axis, and the word line WL1 is corresponding to the data pages P5-P8 lined up along with X-axis. The word lines WL0 and WL1 are adjacent to each other along Y-axis. Each data page P1-P8 includes, for example, memory cells stacked up to K-layers along Z-axis, where K is a positive integer.

If the memory cells of the data pages P1-P8 are MLC structured, then, according to both the physical location interleaving condition and the data leveling condition, the data pages P1, P3, P6, and P8 that are not physically adjacent to each other can be categorized to a sub-block 602 for storing the high bit data, and to sub-blocks 604 for storing the low bit data. The data pages P2, P4, P5, and P7 that are not physically adjacent to each other can be categorized to a sub-blocks 606 for storing the high bit data, and to a sub-blocks 608 for storing the low bit data.

To be more generalized, if the physical memory block PB includes multiple data units DU structured by N-level memory cells, a set of data units DU that are not physically adjacent to each other will be split to N sub-blocks, to respectively store the first bit of data, the second bit of data, . . . , and the N-th bit of data. As shown in FIG. 6, a set of the data units DU (e.g., data pages P1, P3, P6, and P8) is divided to a sub-block (e.g., the sub-block 602) for storing the high bit data of the set of data units DU, and a sub-block (e.g., the sub-block 604) for storing the low bit data of the set of data units DU.

Similarly, another set of data units DU (taking data pages P2, P4, P5, and P7 as example) in the physical memory block PB that are not physically adjacent to each other will be divided to N sub-blocks, to separately store the first bit of data, the second bit of data, . . . , and the N-th bit of data. As shown in FIG. 6, a set of data units DU (e.g., data pages P2, P4, P5, and P7) is divided to a sub-block (e.g., sub-block 606) for storing the high bit data of the other set of data units DU, and a sub-block (e.g., sub-block 608) for storing the low bit data of the other set of data units DU.

Figure 7:
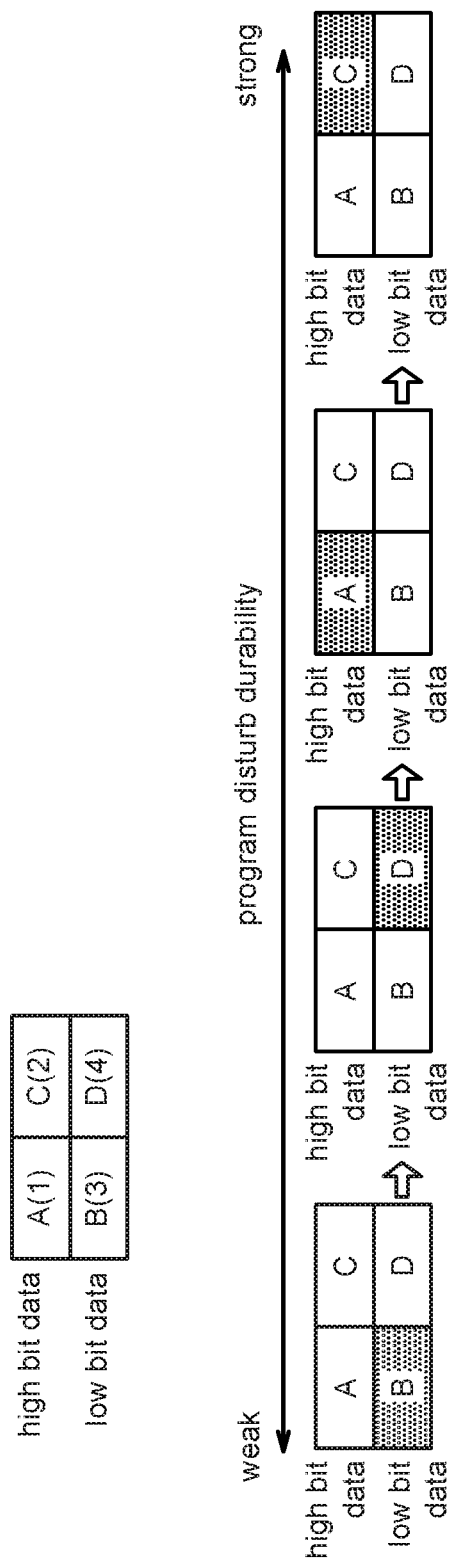
FIG. 7 illustrates the weak to strong relationship of the program disturb durability between the sub-blocks partitioned according to the physical location interleaving condition and the data leveling condition.

FIG. 7 illustrates the weak to strong relationship of the program disturb durability between the sub-blocks split according to the physical location interleaving condition and the data leveling condition. In the example in FIG. 7, the sub-blocks A and B are corresponding to the data units DU that are not physically adjacent to each other, and used for storing the high bit data and the low bit data respectively; the sub-blocks C and D are corresponding to another data units DU that are not physically adjacent to each other, and used for storing the high bit data and the low bit data respectively.

According to default program settings, the controller may program MLC data to the sub-blocks A-D based on the following program order: A→C→B→D, from the first to the last. In FIG. 7, numbers inside brackets represent the order to be programmed for the plurality of sub-blocks.

Due to that low bit data corresponds to a narrower tolerable margin, it is easier to be affected by program disturb in comparison with high bit data. In addition, "later-to-program" sub-blocks may cause program disturb to the nearby "first-to-program" sub-blocks. Based on these two factors, the program disturb durability for the sub-blocks A-D can then be determined. Specifically, since the sub-block B is used for storing the low bit data and the stored data could be affected by the later-to-program sub-block D, the sub-block B has the lowest program disturb durability. As for the sub-block D, it has a second lowest program disturb durability since the sub-block D is used for storing the low bit data. Although the sub-block A is used for storing the high bit data, it has a second highest program disturb durability since its stored data could be affected by the "later-to-program" sub-blocks C, B and D. Lastly, the sub-block C has the highest program disturb durability not only because it is used for storing the high bit data but also because it is later to be programmed in contrast with the sub-block A, and could be affected by the later-to-program sub-blocks B and D only.

Understandably, based on the same principles, the program disturb durability for the sub-blocks using different data storing structure (e.g., N-level memory cell structure) and different programming order can be determined.

FIG. 8 illustrates the priority for allocating hot data for the sub-blocks A-D shown in FIG. 7. Based on the hot data allocation order, a controller (e.g., controller 204) may firstly search for an empty sub-block with the lowest program disturb durability to allocate hot data. As shown in FIG. 8, the controller may firstly search for the empty sub-block B to allocate the hot data. Specifically, since the program order for the sub-blocks A-D from the first to the last is A→C→B→D, when the time arrives for the sub-block B to be programmed and the sub-block B is empty, the controller may firstly choose the sub-block B to allocate the hot data.

When the controller could not find any empty sub-block B, the controller may turn to search for an empty sub-block A to allocate the hot data, instead of searching for an empty sub-block D with second lowest program disturb durability. This is because that, if the hot data were written to sub-block D, the sub-block B would have program disturb. Since the sub-block B has the lowest program disturb durability, data already stored in the sub-block B has a high possibility to have errors due to program disturb. To avoid this circumstance, the sub-block D is the last sub-block chosen to allocate the hot data. Therefore, in this example, the sub-block B has the highest priority to allocate data, and the priority descends in the order of A, C, and D. In FIG. 8, numbers inside brackets represent hot data allocation order of the plurality of sub-blocks A-D.

FIG. 9 illustrates the priority for allocating cold data for the sub-blocks A-D in FIG. 7. Based on the cold data allocation order, a controller (e.g., controller 204) may firstly search for an empty sub-block with the highest program disturb durability to allocate the cold data. As shown in FIG. 9, the controller may firstly search for an empty sub-block C to allocate cold data. Specifically, since the program order for the sub-blocks A-D from the first to the last is A→C→B→D, when the time arrives for the sub-block C to be programmed and the sub-block C is empty, the controller may firstly choose the sub-block C to allocate the cold data. When the controller could not find any empty sub-block C, the controller may turn to search for an empty sub-block A to be written the cold data. When the controller could not find any empty sub-block A, the controller then turns to search for an empty sub-block B to be written the cold data, instead of searching for an empty sub-block D with the second lowest program disturb durability. This is because that, if the cold data were written to the sub-block D, the sub-block B would have program disturb. Since the sub-block B has the lowest program disturb durability, the data already stored in the sub-block B has a high possibility to have errors due to program disturb. To avoid this circumstance, the sub-block D is the last sub-block chosen to be written the cold data. Therefore, in this example, the sub-block C has the highest priority to be written data, and the priority descends in the order of A, B, and D. In FIG. 9, numbers inside brackets represent the cold data allocation order of the plurality of sub-blocks A-D.

Figure 10:
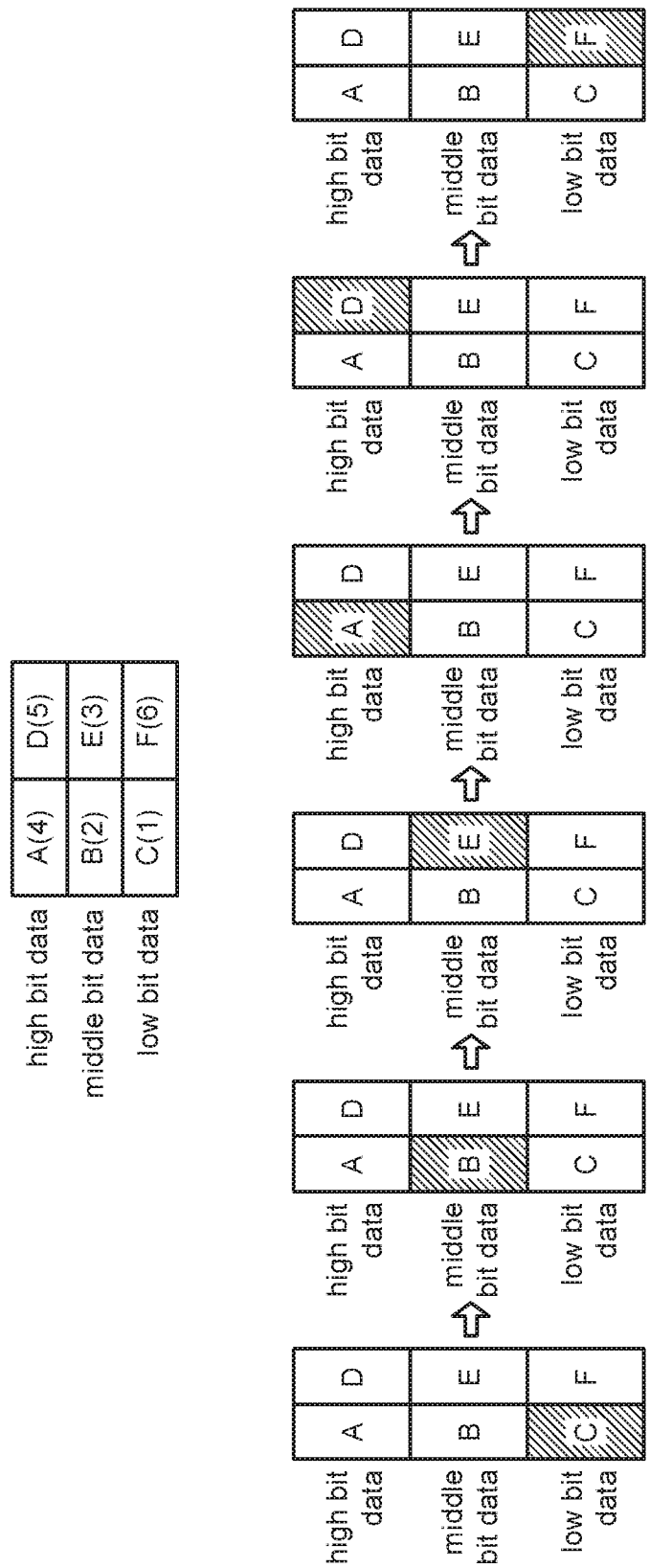
FIG. 10 illustrates the priority for allocating hot data for TLC-based sub-blocks.

FIG. 10 illustrates the priority for allocating hot data for TLC-based sub-blocks A-F. In this example, the sub-blocks A and D are used for storing the high bit data, wherein the sub-block A is the portion of first-to-program (corresponding to a set of data units DU) and the sub-block D is the portion of later-to-program (corresponding to another set of data units DU). The sub-blocks B and E are used for storing the middle bit data, wherein the sub-block B is the portion of first-to-program and the sub-block E is the portion of later-to-program. The sub-blocks C and F are used for storing the low bit data, wherein the sub-block C is the portion of first-to-program and the sub-block F is the portion of later-to-program. If the tolerable margin for programming the high bit data is higher than the tolerable margin for programming the middle bit data, and the tolerable margin for programming the middle bit data is higher than the tolerable margin for programming the low bit data, then the program disturb durability for the sub-blocks A-F are ordered as C→F→B→E→A→D from the weakest to strongest.

At this point, if the data to be written is hot data, based on the hot data allocation order, the order of the sub-blocks A-F to be allocated with the hot data can be determined as: C→B→E→A→D→F from the first to the last. In FIG. 10, numbers inside brackets represent the hot data allocation order of sub-blocks A-F.

Figure 11:
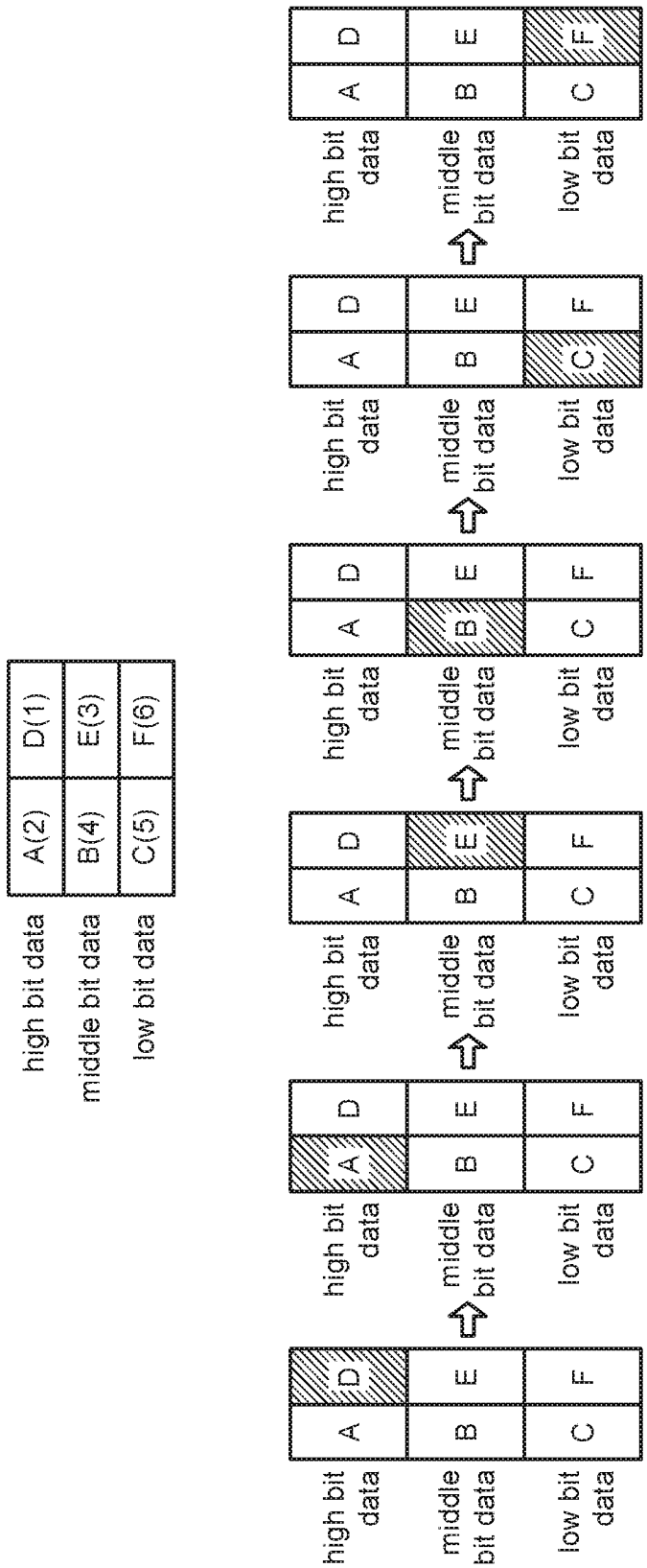
FIG. 11 illustrates the priority for allocating cold data for TLC-based sub-blocks.

FIG. 11 illustrates the priority for allocating cold data for TLC-based sub-blocks A-F. Similar to the example of FIG. 10, the sub-blocks A and D are used for storing the high bit data, wherein the sub-block A is the portion of first-to-program (corresponding to a set of data units DU) and the sub-block D is the portion of later-to-program (corresponding to another set of data units DU). The sub-blocks B and E are used for storing the middle bit data, wherein the sub-block B is the portion of first-to-program and the sub-block E is the portion of later-to-program. The sub-blocks C and F are used for storing the low bit data, wherein the sub-block C is the portion of first-to-program and the sub-block F is the portion of later-to-program. If the tolerable margin for programming the high bit data is higher than the tolerable margin for programming the middle bit data, and the tolerable margin for programming the middle bit data is higher than the tolerable margin for programming the low bit data, then the program disturb durability for the sub-blocks A-F are ordered as C→F→B→E→A→D from the weakest to strongest.

At this point, if the data to be written is cold data, based on the cold data allocation order, order of the sub-blocks A-F to be allocated with the cold data can be determined as: D→A→E→B→C→F from the first to the last. In FIG. 10, numbers inside brackets represent the cold data allocation order of sub-blocks A-F.

Based on the above, the proposed data allocating method and electric system using the same mitigate the effects of program disturb. Through partitioning the physical memory block of a memory, and allocating data to the partitioned sub-blocks based on the hot/cold feature of data, errors caused by program disturb can be effectively reduced, and the reliability of memory can be improved.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:
1. A data allocating method, comprising:
   determining whether data to be written into a physical memory block is hot data or cold data;
   when the data is hot data, according to a hot data allocating order, searching at least one first empty sub-block from the physical memory block to allocate the data;
   when the data is cold data, according to a cold data allocating order, searching at least one second empty sub-block from the physical memory block to allocate the data; and
   when the data is hot data, and programming the at least one first empty sub-block will cause program disturb to a sub-block with lowest program disturb durability in the physical memory block, skipping the at least one first empty sub-block, and turning to select another empty sub-block to allocate the data;
   wherein the at least one first empty sub-block has higher program priority and narrower tolerable margin than the at least one second empty sub-block;
   the tolerable margin is a minimum tolerable spacing between two adjacent data states, each of the data states corresponding to a threshold voltage distribution of a memory cell and representing a data value; and
   the sub-block with the lowest program disturb durability is with the highest program priority in the physical memory block and with the narrowest tolerable margin.

2. The data allocating method according to claim 1, further comprising:
   when the data is cold data, and programming the at least one second empty sub-block will cause program disturb to a sub-block with lowest program disturb durability in the physical memory block, skipping the at least one second empty sub-block, and turning to select another empty sub-block to allocate the data;
   wherein the sub-block with the lowest program disturb durability is with the highest program priority in the physical memory block and with the narrowest tolerable margin.

3. The data allocating method according to claim 1, wherein the physical memory block includes a plurality of data units, a set of the data units that are not physically adjacent to each other are partitioned into a first sub-block and a second sub-block, the first sub-block is used for storing high bit data of the set of the data units, and the second sub-block is used for storing low bit data of the set of the data units;
   another set of the data units that are not physically adjacent to each other are partitioned into a third sub-block and a fourth sub-block, the third sub-block is used for storing high bit data of the other set of the data units, and the fourth sub-block is used for storing low bit data of the other set of the data units;
   program order for the first to fourth sub-blocks in the physical memory block from the first to the last is: the first sub-block, the third sub-block, the second sub-block, and the fourth sub-block;
   the data allocating method further comprises:
   when the data is hot data, prioritizing looking for, in the physical memory block, the second sub-block that is empty to be written the data; and
   when the data is cold data, prioritizing looking for, in the physical memory block, the third sub-block that is empty to allocate the data.

4. The data allocating method according to claim 3, further comprising:
when the data is hot data, and the second sub-block that is empty is not found, turning to find the first sub-block that is empty to allocate the data.

5. The data allocating method according to claim 3, wherein, based on the hot data allocation order, the second sub-block has the highest priority to be chosen to allocate the data, the first sub-block has the second highest priority to be chosen to allocate the data, the third sub-block has the third highest priority to be chosen to allocate the data, and the fourth sub-block has the lowest priority to be chosen to allocate the data.

6. The data allocating method according to claim 3, further comprising:
when the data is cold data, and the third sub-block that is empty is not found, turning to find the first sub-block that is empty to allocate the data.

7. The data allocating method according to claim 3, wherein, based on the cold data allocation order, the third sub-block has the highest priority to be chosen to allocate the data, the first sub-block has the second highest priority to be chosen to allocate the data, the second sub-block has the third highest priority to be chosen to allocate the data, and the fourth sub-block has the lowest priority to be chosen to allocate the data.

8. The data allocating method according to claim 1, wherein the quantity of the at least one first empty sub-block is plural, and the data allocating method further comprises:
when the data is hot data, comparing the quantity of invalid data in each sub-block neighboring each of the first empty sub-blocks, and writing the data into one of the first empty sub-blocks neighboring the most invalid data.

9. The data allocating method according to claim 1, wherein the quantity of the at least one second empty sub-block is plural, and the data allocating method further comprises:
when the data is cold data, comparing the quantity of invalid data in each sub-block neighboring each of the second empty sub-blocks, and writing the data into one of the second empty sub-blocks neighboring the most invalid data.

10. An electric system, comprising:
a memory including a physical memory block; and
a controller, coupled to the memory, being configured to:
determine whether data to be written into the physical memory block is hot data or cold data;
when the data is hot data, according to a hot data allocating order, search at least one first empty sub-block from the physical memory block to allocate the data; and
when the data is cold data, according to a cold data allocating order, search at least one second empty sub-block from the physical memory block to allocate the data;
wherein the at least one first empty sub-block has higher program priority and narrower tolerable margin than the at least one second empty sub-block;
the tolerable margin is a minimum tolerable spacing between two adjacent data states, each of the data states corresponding to a threshold voltage distribution of a memory cell and representing a data value;
when the data is hot data, and programming the at least one first empty sub-block will cause program disturb to a sub-block with lowest program disturb durability in the physical memory block, the controller skips the at least one first empty sub-block, and turns to select another empty sub-block to allocate the data; and
the sub-block with the lowest program disturb durability is with the highest program priority in the physical memory block and with the narrowest tolerable margin.

11. The electric system according to claim 10, wherein when the data is cold data, and programming the at least one second empty sub-block will cause program disturb to a sub-block with lowest program disturb durability in the physical memory block, the controller skips the at least one second empty sub-block, and turns to select another empty sub-block to allocate the data;
wherein the sub-block with the lowest program disturb durability is with the highest program priority in the physical memory block and with the narrowest tolerable margin.

12. The electric system according to claim 10, wherein the physical memory block includes a plurality of data units, a set of the data units that are not physically adjacent to each other are partitioned into a first sub-block and a second sub-block, the first sub-block is used for storing high bit data of the set of the data units, and the second sub-block is used for storing low bit data of the set of the data units;
another set of the data units that are not physically adjacent to each other are partitioned into a third sub-block and a fourth sub-block, the third sub-block is used for storing high bit data of the other set of the data units, and the fourth sub-block is used for storing low bit data of the other set of the data units;
program order for the first to fourth sub-blocks in the physical memory block from the first to the last is: the first sub-block, the third sub-block, the second sub-block, and the fourth sub-block;
the controller is further configured to:
when the data is hot data, prioritize looking for, in the physical memory block, the second sub-block that is empty to allocate the data; and
when the data is cold data, prioritize looking for, in the physical memory block, the third sub-block that is empty to allocate the data.

13. The electric system according to claim 12, wherein when the data is hot data, and the controller does not find the second sub-block that is empty, the controller turns to find the first sub-block that is empty to allocate the data.

14. The electric system according to claim 12, wherein, based on the hot data allocation order, the second sub-block has the highest priority to be chosen to allocate the data, the first sub-block has the second highest priority to be chosen to allocate the data, the third sub-block has the third highest priority to be chosen to allocate the data, and the fourth sub-block has the lowest priority to be chosen to allocate the data.

15. The electric system according to claim 12, wherein when the data is cold data, and the controller does not find the third sub-block that is empty, the controller turns to find the first sub-block that is empty to allocate the data.

16. The electric system according to claim 15, wherein, based on the cold data allocation order, the third sub-block has the highest priority to be chosen to allocate the data, the first sub-block has the second highest priority to be chosen to allocate the data, the second sub-block has the third highest priority to be chosen to allocate the data, and the fourth sub-block has the lowest priority to be chosen to allocate the data.

17. The electric system according to claim 10, wherein the quantity of the at least one first empty sub-block is plural, when the data is hot data, the controller compares the quantity of invalid data in each sub-block neighboring each of the first empty sub-blocks, and writes the data into one of the first empty sub-blocks neighboring the most invalid data.

18. The electric system according to claim 10, wherein the quantity of the at least one second empty sub-block is plural, when the data is cold data, the controller compares the quantity of invalid data in each sub-block neighboring each of the second empty sub-blocks, and writes the data into one of the second empty sub-blocks neighboring the most invalid data.

* * * * *